United States Patent [19]
Hollett

[11] Patent Number: 4,574,959
[45] Date of Patent: Mar. 11, 1986

[54] CARRIER RACK FOR ELECTRIC STORAGE BATTERY PLATES

[75] Inventor: Ronald J. Hollett, Glendora, Calif.

[73] Assignee: Concorde Battery Corp., West Covina, Calif.

[21] Appl. No.: 566,039

[22] Filed: Dec. 27, 1983

Related U.S. Application Data

[63] Continuation of Ser. No. 401,964, Jul. 26, 1982.

[51] Int. Cl.⁴ ............................................. A47G 19/08
[52] U.S. Cl. ..................................... 211/41; 361/415; 206/334
[58] Field of Search ................... 211/41, 40, 162, 182, 211/184; 361/415; 429/130, 163; 204/2.1; 206/334, 329

[56] References Cited

U.S. PATENT DOCUMENTS

| | | | |
|---|---|---|---|
| 1,451,801 | 4/1923 | Angell | 204/2.1 |
| 1,473,817 | 11/1923 | Gorsline | 211/182 X |
| 1,480,939 | 1/1924 | Hand | 211/40 |
| 1,621,327 | 3/1927 | Lehman | 211/41 |
| 3,877,134 | 3/1975 | Shanahan | 211/41 X |
| 3,984,255 | 10/1976 | Tiegel | 204/297 R X |
| 4,321,654 | 3/1982 | Nakajo et al. | 211/41 X |

FOREIGN PATENT DOCUMENTS

| | | | |
|---|---|---|---|
| 33061 | 8/1981 | European Pat. Off. | 204/2.1 |
| 52439 | 5/1966 | Fed. Rep. of Germany | 361/415 |

Primary Examiner—Robert W. Gibson, Jr.
Assistant Examiner—Blair M. Johnson
Attorney, Agent, or Firm—Keith D. Beecher

[57] ABSTRACT

A carrier rack is provided for transporting electric storage battery plates through the storage battery manufacturing process. The rack is provided with spaced vertical slots for supporting the plates in upright parallel positions spaced from one another, with the positive and negative plates alternately interspersed with one another, and with the lugs of the positive plates extending upwardly along one side of the rack, and the lugs of the negative plates extending upwardly along the other side of the rack. The lugs on each side of the rack are interconnected at the top of the rack by respective ones of a pair of conductive bars. The rack is immersed in an electrolyte, and an electric voltage is applied across the bars to cause charging current to flow through the plates. Strip support members are provided which may be received in openings in the sides of the rack at different predetermined levels, to provide supports for the plates within the rack at selected levels, depending upon the height of the particular plates being processed. The rack is readily demountable, and it may easily be adapted to receive plates of different widths, merely by interposing different end members between the side members. Also, the racks of the invention may be conveniently shipped in a knocked-down condition.

4 Claims, 7 Drawing Figures

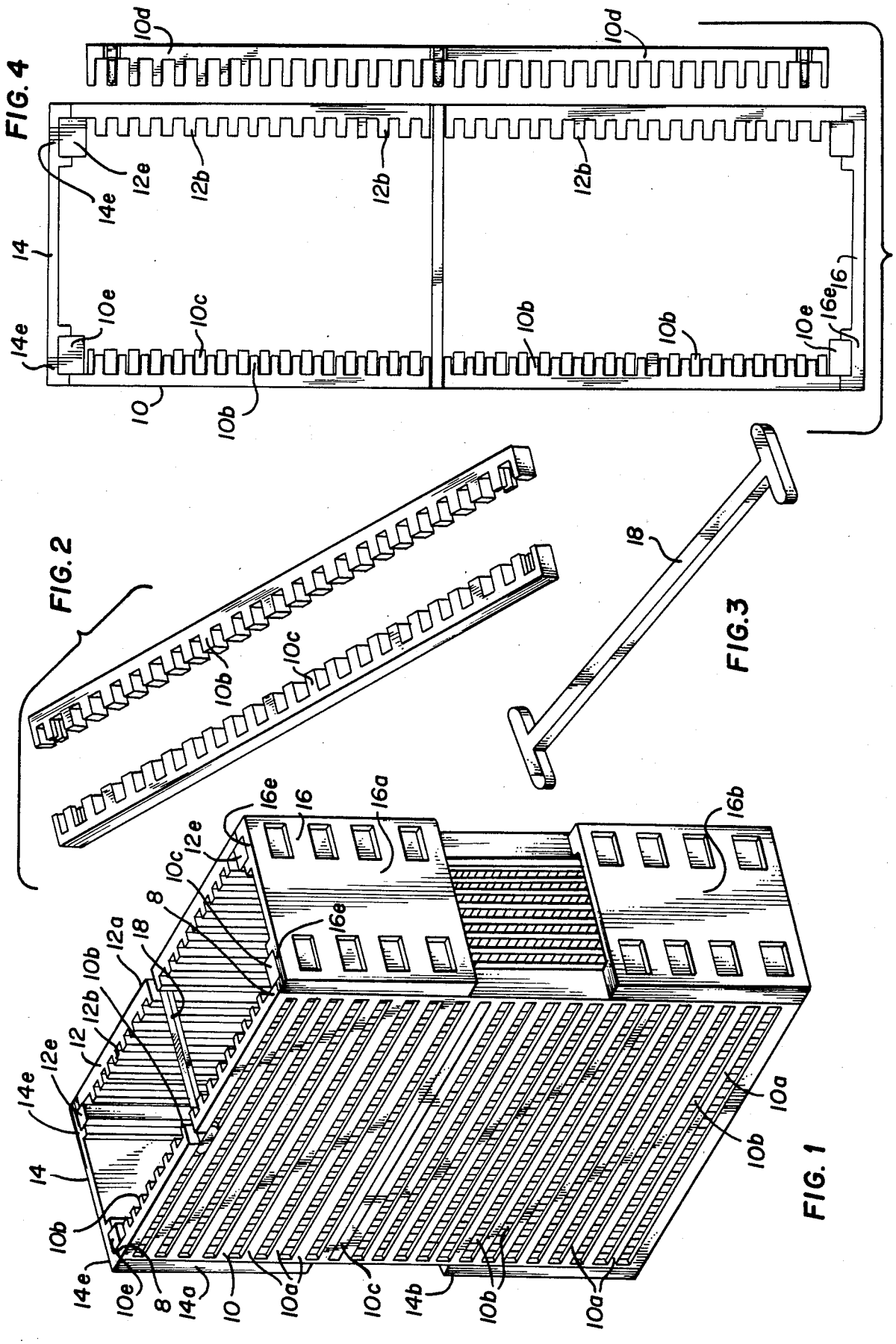

CARRIER RACK FOR ELECTRIC STORAGE BATTERY PLATES

This application is a continuation of Copending Application Ser. No. 401,964, filed July 26, 1982.

BACKGROUND OF THE INVENTION

The racks of the invention have particular utility for use in storage battery manufacturing processes of the general type, for example, described in U.S. Pat. No. 3,984,255 which issued Oct. 5, 1976 to Ernest Tiegel, Class 204/2.1. As described in the Tiegel patent, large numbers of storage battery plates may be efficiently handled through the various processing steps by placing them in a plurality of portable racks which serve to support and transport the plates through a charging step in which the racks containing the plates are placed in tanks filled with an electrolyte and connected to a source of electrical charging energy, and through subsequent washing and drying steps.

The rack of the present invention has particular utility in such a manufacturing process, as mentioned above. The rack of the invention is formed to have two opposite sides, each of which contains a number of vertical slots, so that the positive and negative battery plates may be successively supported, each extending across the rack, in mutually spaced and parallel relationship. As mentioned above, the lugs of the positive plates are all positioned at one side of the rack, and the lugs of the negative plates are all positioned at the other side of the rack. Both sets of lugs extend upwardly beyond the top of the rack. A first conductive bar is welded to the lugs of the positive plates at one side of the rack, and a second conductive bar is welded to the lugs of the negative plates at the other side of the rack. The bars extend across the top of the rack from one end to the other, and are connected to an appropriate source of direct current charging electric power.

The top and bottom of the rack is open, and the sides have openings therein, so that the electrolyte may freely flow through the rack and into contact with the battery plates. Elongated strips are provided with teeth that fit through the openings on both sides at any selected level. These strips provide a bottom support for the battery plates, so that plates of a variety of heights may be contained in the rack, with their lugs extending beyond the top of the rack a sufficient distance to permit the conductive bars to be welded thereto.

The side members of the rack are coupled to the end members in a tongue-and-groove relationship, and the racks can be easily disassembled, so that end members of different widths can be used so as to accommodate different sized plates within the rack. Also, the fact that the racks can be easily knocked down and set up facilitates the shipment thereof, since they can be shipped in a knocked-down condition in compact shipping containers.

BRIEF DESCRIPTION OF THE DRAWINGS

FIG. 1 is a perspective view of a rack constituting one embodiment of the invention;

FIG. 2 is a perspective view of a pair of elongated strips which are received in the side of the rack of FIG. 1 to form adjustable supports for the battery plates supported in the rack;

FIG. 3 is a perspective view of a cross-brace which is removably received in the sides of the rack of FIG. 1, and which extends across the top of the rack intermediate the ends;

FIG. 4 is a top plan view of the rack of FIG. 1;

DETAILED DESCRIPTION OF THE ILLUSTRATED EMBODIMENT

Figure 5:
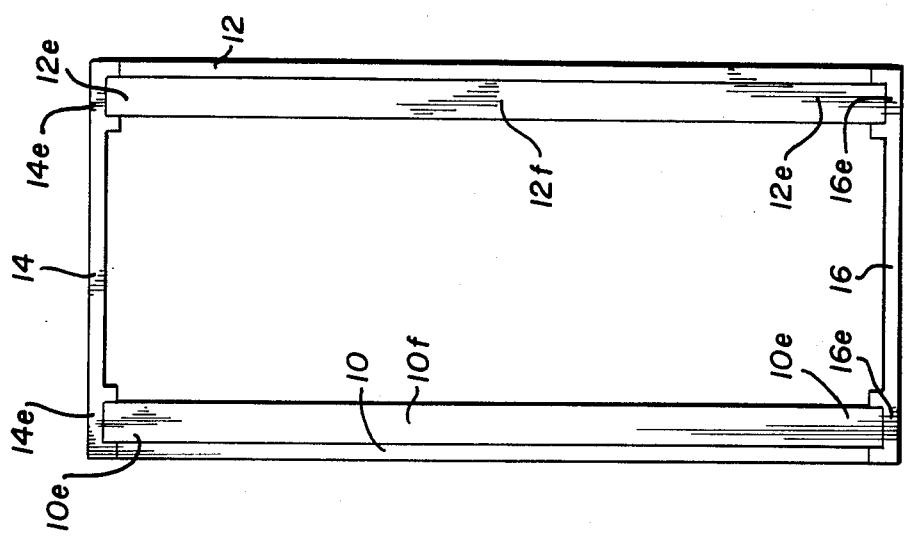
FIG. 5 is a bottom view of the rack of FIG. 1.

The rack of the invention, as shown in FIGS. 1-7, has a rectangular configuration, and it is composed of a pair of rectangular side members 10 and 12, and a pair of rectangular ends members 14 and 16. The side members 10 and 12 have integral tongues 10e and 12e at each end extending from top to bottom. The end members 14 and 16 have elongated integral sections 14e and 16e at each end extending from top to bottom which form grooves for receiving the tongues 10e and 12e in tight frictional fit. As shown, the side members 10, 12 and end members 14, 16 are intercoupled by the tongue-and-groove coupling relationship described above, and are held together as a rigid structure.

A removable cross-brace 18 (FIG. 3) is received in a slot in the side members 10 and 12, as shown in FIG. 1, and it may be removed by pressing the side members towards one another until the ends of the brace protrude outwardly from the outer surface of each of the side members, permitting the brace to be removed by displacing it upwardly through the top edges of the side.

As illustrated, the end members 14 and 16 are each composed of two sections, such as sections 14a, 14b and 16a, 16b which are spaced from one another to provide openings in the ends of the rack. The top and bottom of the rack are also open. Each of the side members 10 and 12 is formed of a plurality of horizontal elongated members, such as members 10a, 12a which are integral with a corresponding plurality of vertical elongated members, such as the members 10b and 12b, with openings being formed in both sides between the horizontal and vertical members.

Figure 6:
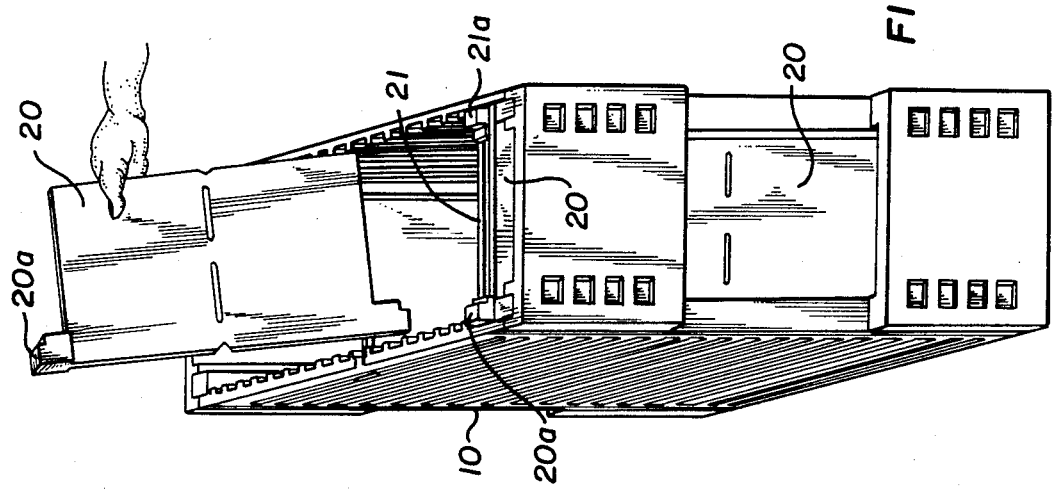
FIG. 6 shows a typical storage battery plate which is supported in the rack, a pair of interconnected plates being shown which are later detached from one another after they have been charged, and also showing the manner in which the plates are stacked within the rack.

The vertical members 10b, 12b form vertical slots for receiving the battery plates, such as the negative plate 20 in FIG. 6. Inwardly extending lip members 10f, 12f (FIG. 5) are formed integral with each of the side members 10, 12 at the lower edge thereof for supporting the battery plates within the rack. For shorter battery plates, toothed strips 10c, 10d (FIG. 2) may be fitted into the openings between the horizontal and vertical elongated members 10a, 10b and 12a, 12b on both sides with their teeth projecting into the interior of the rack as shown in FIG. 4. These strips 10c, 10d may be inserted into the sides of the rack at any selected level, so that the rack is adapted to support battery plates of a wide range of different lengths.

Figure 7:
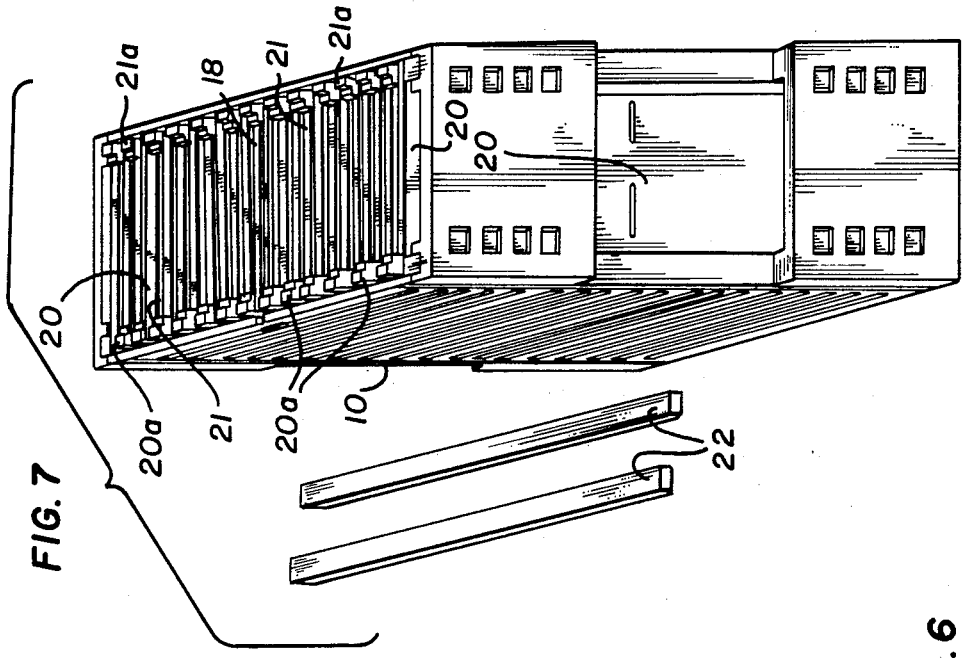
FIG. 7 is a perspective view of the rack, taken from above the rack, and showing the plates stacked within the rack, together with conductive bars which are subsequently welded to the lugs at each side of the rack.

The battery plates are stacked in the rack, such as shown in FIGS. 6 and 7, with the positive plates 21 being interposed between the negative plates 20. The lugs 20a of the positive plates 20 extend upwardly at one side of the rack, and the lugs 21a of the negative plates 21 extend upwardly at the other side of the rack, such as shown in FIG. 7. The lugs are interconnected by appropriate conductive bars, such as bars 22, which are respectively welded to the lugs 20a and 21a at each side of the rack by a subsequent step in the battery manufacturing process.

The conductive bars 22 are then connected to an appropriate direct current power source, so that charging current may be provided for the plates. During the processing, and as described above, the racks containing the plates are placed in an electrolyte, and charging current is caused to flow through the plates. Subsequently the bars 22 are disconnected from the power source, and the racks and plates are removed from the electrolyte and placed in a tank of washing solution, and then the plates are permitted to dry while still being contained in the racks. As a final step in the process the plates are removed from the racks and sorted into positive and negative plates.

The rack is preferably formed of polycarbonate plastic, which has high resistivity to acid, and is capable of withstanding high temperatures. The open construction of the rack permits free circulation of the electrolyte, and of the washing solution, and drying air.

It is evident that although a particular embodiment of the invention has been shown and described, modifications may be made. It is intended in the claims to cover all modifications which come within the true spirit and scope of the invention.

What is claimed is:

1. A knock-down rectangular rack having an open top and an open bottom for containing and transporting a plurality of positive and negative storage battery plates having end lugs comprising: first and second side members and first and second end members intercoupled in a tongue-and-groove relationship to one another to form a rigid structure with said side members in mutually spaced and parallel relationship, and with said end members in mutually spaced and parallel relationship; a plurality of spaced and parallel vertical elongated members forming a plurality of vertical slots on the inner surface of each of said side members and a plurality of spaced and parallel horizontal elongated members integral with the vertical elongated members, said vertical elongated members serving to support said battery plates in spaced and parallel relationship, with each of said battery plates extending across the rack from one of the side members to the other, and with the lugs of the positive battery plates extending upwardly at one side of the rack and the lugs of the negative battery plates extending upwardly at the other side of the rack, said vertical and horizontal elongated members forming a multiplicity of openings therebetween in each of the side members; and a pair of elongated strip members, each having a series of teeth to be received in the openings in each of said side members at any selected level thereof, the strip members extending inwardly from the respective side members to provide a support for the battery plates at different levels within the rack.

2. The rack defined in claim 1, and which is formed of a polycarbonate plastic material.

3. The rack defined in claim 1, and which includes a removable elongated brace extending across the rack from one side to the other at the top of the rack and intermediate the ends thereof.

4. A rectangular rack having an open top and an open bottom for containing and transporting a plurality of positive and negative storage battery plates comprising: first and second side members and first and second end members intercoupled to one another to form a rigid structure, with said side members in mutually spaced and parallel relationship, and with said end members in mutually spaced and parallel relationship; each of said side members being composed of a first plurality of spaced and parallel vertical elongated members forming a plurality of vertical slots on the inner surface thereof for supporting said battery plates in spaced and parallel relationship, with each of said plates extending across the rack from one of the sides to the other, and each of said side members being formed of a second plurality of spaced and parallel horizontal elongated members integral with the outer surfaces of said vertical elongated members to provide openings in said side members; and which includes a pair of elongated strip members, each having a series of teeth to be received in the openings in said side members at any selected level thereof to provide a support for the battery plates in the rack at different predetermined levels within the rack.

* * * * *